US012684732B2

(12) United States Patent
Chen et al.

(10) Patent No.: US 12,684,732 B2
(45) Date of Patent: Jul. 14, 2026

(54) SINGLE-PHASE IMMERSION LIQUID COOLING SYSTEM, LIQUID COOLING METHOD, AND STORAGE MEDIUM

(71) Applicant: SHENZHEN MICROBT ELECTRONICS TECHNOLOGY CO., LTD., Guangdong (CN)

(72) Inventors: Qian Chen, Guangdong (CN); Yuefeng Wu, Guangdong (CN); Yang Gao, Guangdong (CN); Fangyu Liu, Guangdong (CN); Haifeng Guo, Guangdong (CN)

(73) Assignee: SHENZHEN MICROBT ELECTRONICS TECHNOLOGY CO., LTD., Guangdong (CN)

( * ) Notice: Subject to any disclaimer, the term of this patent is extended or adjusted under 35 U.S.C. 154(b) by 378 days.

(21) Appl. No.: 18/038,779

(22) PCT Filed: Mar. 6, 2023

(86) PCT No.: PCT/CN2023/079780
§ 371 (c)(1),
(2) Date: May 25, 2023

(87) PCT Pub. No.: WO2023/185384
PCT Pub. Date: Oct. 5, 2023

(65) Prior Publication Data
US 2024/0365508 A1 Oct. 31, 2024

(30) Foreign Application Priority Data
Mar. 31, 2022 (CN) ......................... 202210328486.6

(51) Int. Cl.
*H05K 7/20* (2006.01)

(52) U.S. Cl.
CPC ..... *H05K 7/20281* (2013.01); *H05K 7/20236* (2013.01)

(58) Field of Classification Search
CPC ....................... H05K 7/20281; H05K 7/20236
(Continued)

(56) References Cited

U.S. PATENT DOCUMENTS

2002/0169573 A1* 11/2002 Reuschenbach ..... G05D 7/0635
702/100
2004/0238040 A1 12/2004 Furukawa
(Continued)

FOREIGN PATENT DOCUMENTS

CN 201620128 U 11/2010
CN 102369398 A 3/2012
(Continued)

OTHER PUBLICATIONS

First Chinese Office Action for Application No. 202210328486.6 dated May 10, 2022 (16 pages with English Translation).
(Continued)

*Primary Examiner* — Mark A Connolly
*Assistant Examiner* — Michael V Farina
(74) *Attorney, Agent, or Firm* — Merchant & Gould P.C.

(57) ABSTRACT

A single-phase immersion liquid cooling system, a liquid cooling method, and a storage medium are provided. The liquid cooling system includes a liquid supply main pipe and a liquid return main pipe; at least one liquid cooling cabinet, wherein each liquid cooling cabinet includes a liquid inlet and a liquid return opening, the liquid inlet of each liquid cooling cabinet being in communication with the liquid supply main pipe through a liquid supply sub-pipe of each liquid cooling cabinet, and the liquid return opening of each liquid cooling cabinet being in communication with the liquid return main pipe through a liquid return sub-pipe of each liquid cooling cabinet; and a flow regulation unit, including a pressure difference detection apparatus and a flow regulation apparatus, wherein the pressure difference detection apparatus is used to detect a pressure difference between a coolant flowing into the pressure difference detection apparatus and a coolant flowing out of the pressure difference detection apparatus, and the flow regulation apparatus is used to regulate a flow of the coolant; wherein the pressure difference detection apparatus and the flow regulation apparatus are separately in a signal connection to a control unit; and the liquid supply sub-pipe is provided with the flow regulation unit, so that the control unit regulates, based on the pressure difference of the at least one liquid supply sub-pipe, a flow of a coolant flowing into the at least one liquid supply sub-pipe.

(Continued)

S10: Obtain a pressure difference of at least one liquid supply sub-pipe

S20: Monitor the pressure difference of the at least one liquid supply sub-pipe that is obtained by a pressure difference detection apparatus S30: Dynamically regulate an opening degree of a flow regulation unit of each of the at least one liquid supply sub-pipe based on a condition of comparison between a target pressure difference value and the corresponding pressure difference of the at least one liquid supply sub-pipe S40: Dynamically regulate an operating power of a power unit based on a condition of matching between the pressure difference and the corresponding target pressure difference value of the at least one liquid supply sub-pipe and the opening degree of at least one flow regulation unit The liquid cooling solution of embodiments of this application is conducive to improving flow regulation precision of the liquid cooling system.

10 Claims, 2 Drawing Sheets

(58) Field of Classification Search
USPC .......................................... 700/301; 361/700
See application file for complete search history.

(56) References Cited

U.S. PATENT DOCUMENTS

| | | | | |
|---|---|---|---|---|
| 2010/0147394 | A1 | 6/2010 | Trnka et al. | |
| 2011/0060470 | A1* | 3/2011 | Campbell | G05D 23/1934 |
| | | | | 700/282 |
| 2013/0048114 | A1* | 2/2013 | Rothman | F24D 19/1012 |
| | | | | 137/551 |
| 2013/0213142 | A1* | 8/2013 | Irani | G01F 1/40 |
| | | | | 73/861.52 |
| 2015/0233746 | A1* | 8/2015 | Igarashi | G01F 1/42 |
| | | | | 73/861.61 |
| 2018/0283370 | A1* | 10/2018 | Slaby | H05K 7/20281 |
| 2019/0204126 | A1* | 7/2019 | Kane | G01F 1/363 |
| 2020/0315059 | A1 | 10/2020 | Gao | |
| 2024/0224475 | A1* | 7/2024 | Levee | H05K 7/20236 |

FOREIGN PATENT DOCUMENTS

| | | | | | |
|---|---|---|---|---|---|
| CN | 104822242 | A | * | 8/2015 | |
| CN | 110757243 | A | | 2/2020 | |
| CN | 113865207 | A | * | 12/2021 | F25D 17/02 |
| CN | 215073550 | U | * | 12/2021 | |
| CN | 114423264 | A | | 4/2022 | |

OTHER PUBLICATIONS

Second Chinese Office Action for Application No. 202210328486.6 dated Jun. 7, 2022 (21 pages with English Translation).

* cited by examiner

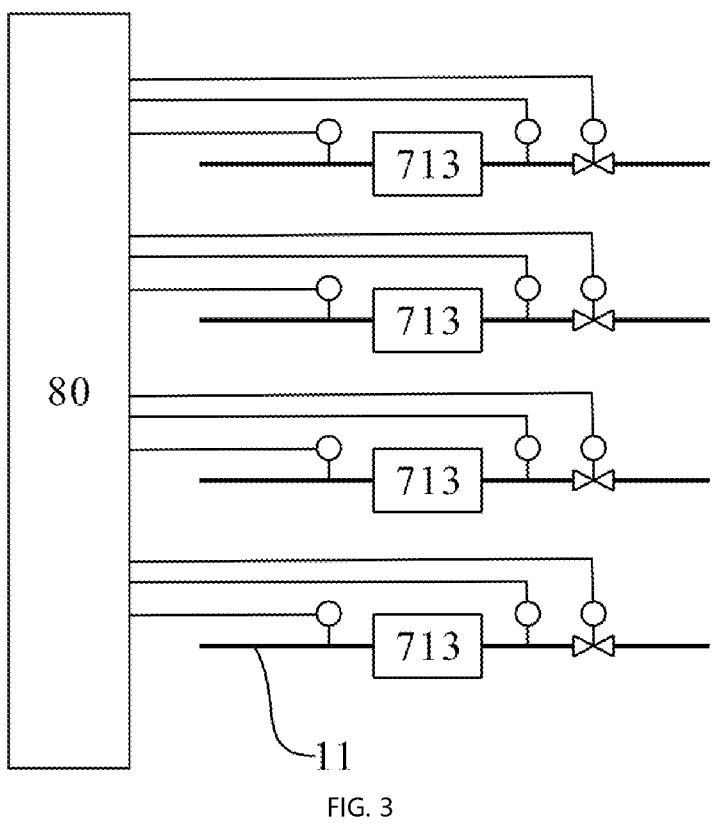

FIG. 3

S10: Obtain a pressure difference of at least one liquid supply sub-pipe

S20: Monitor the pressure difference of the at least one liquid supply sub-pipe that is obtained by a pressure difference detection apparatus S30: Dynamically regulate an opening degree of a flow regulation unit of each of the at least one liquid supply sub-pipe based on a condition of comparison between a target pressure difference value and the corresponding pressure difference of the at least one liquid supply sub-pipe S40: Dynamically regulate an operating power of a power unit based on a condition of matching between the pressure difference and the corresponding target pressure difference value of the at least one liquid supply sub-pipe and the opening degree of at least one flow regulation unit

FIG. 4

SINGLE-PHASE IMMERSION LIQUID COOLING SYSTEM, LIQUID COOLING METHOD, AND STORAGE MEDIUM

CROSS-REFERENCE TO RELATED APPLICATIONS

This application is a National Stage Application of International Application No. PCT/CN2023/079780, filed 6 Mar. 2023, which claims benefit of Ser. No. 202210328486.6 filed 31 Mar. 2022 in China, and which applications are incorporated herein by reference. To the extent appropriate, a claim of priority is made to each of the above disclosed applications.

TECHNICAL FIELD

This application relates to the field of liquid cooling heat dissipation technologies, and in particular, to a single-phase immersion liquid cooling system, a liquid cooling method, and a storage medium.

BACKGROUND

For the heat dissipation problem of electronic devices, currently, the electronic devices may be placed in a single-phase immersion liquid cooling cabinet for liquid cooling heat dissipation. In addition, in consideration of overall costs or efficiency, a plurality of said liquid cooling cabinets may be connected in parallel and arranged on a liquid cooling system, that is, liquid inlets of the plurality of liquid cooling cabinets are separately in communication with a liquid supply main pipe of the liquid cooling system, liquid return openings of the plurality of liquid cooling cabinets are separately in communication with a liquid return main pipe of the liquid cooling system, and a coolant circulates in a circulation pipeline formed by the liquid supply main pipe and the liquid return main pipe to realize liquid cooling heat dissipation for the electronic devices.

In addition, for different liquid cooling cabinets, the required flows of the coolant are different since powers of the electronic devices in the liquid cooling cabinets are different, which relates to regulation on the flows of the coolant in the liquid cooling cabinets, for example, a flow regulator valve is arranged on a liquid supply branch or a liquid return branch, and then the flows of the coolant are regulated in a manual manner.

SUMMARY

For at least one aspect of the foregoing technical problem, embodiments of this application provide a single-phase immersion liquid cooling system, a liquid cooling method, and a storage medium, which are conducive to improving precision of flow regulation.

The embodiments of this application provide a single-phase immersion liquid cooling system including:

a liquid supply main pipe;

a liquid return main pipe;

at least one liquid cooling cabinet, wherein each liquid cooling cabinet includes a liquid inlet and a liquid return opening, the liquid inlet of each liquid cooling cabinet being in communication with the liquid supply main pipe through a liquid supply sub-pipe of each liquid cooling cabinet, and the liquid return opening of each liquid cooling cabinet being in communication with the liquid return main pipe through a liquid return sub-pipe of each liquid cooling cabinet; and a flow regulation unit, including a pressure difference detection apparatus and a flow regulation apparatus, wherein the pressure difference detection apparatus is used to detect a pressure difference between a coolant flowing into the pressure difference detection apparatus and a coolant flowing out of the pressure difference detection apparatus, and the flow regulation apparatus is used to regulate a flow of the coolant;

wherein the pressure difference detection apparatus and the flow regulation apparatus are separately in a signal connection to a control unit; and the liquid supply sub-pipe is provided with the flow regulation unit, so that the control unit regulates, based on the pressure difference of the at least one liquid supply sub-pipe, a flow of a coolant flowing into the at least one liquid supply sub-pipe.

The embodiments of this application further provide a liquid cooling method, wherein the liquid cooling method is applied to the foregoing liquid cooling system, and the liquid cooling method includes:

obtaining a target pressure difference value of at least one liquid supply sub-pipe;

monitoring a pressure difference of the at least one liquid supply sub-pipe that is obtained by a pressure difference detection apparatus; and dynamically regulating an opening degree of a flow regulation unit of each of the at least one liquid supply sub-pipe based on a condition of comparison between the target pressure difference value and the pressure difference of the at least one liquid supply sub-pipe.

An embodiment of this application further provides a computer readable storage medium, including a program instruction, wherein the program instruction, when being executed by a control unit, enable the control unit to perform the liquid cooling method according to the embodiments of this application.

BRIEF DESCRIPTION OF THE DRAWINGS

To describe the technical solutions of embodiments of this application more clearly, the following briefly describes the accompanying drawings required for describing the embodiments of this application. Apparently, the accompanying drawings in the following description show merely some embodiments of this application, and a person of ordinary skill in the art may still derive other drawings from these accompanying drawings without creative efforts.

FIG. 3 is a schematic structural diagram depicting that a pressure difference detection apparatus and a flow regulation unit of each parallel branch are separately in a signal connection to a control unit according to an embodiment of this application.

FIG. 4 is a schematic flowchart of a liquid cooling method according to an embodiment of this application.

REFERENCE NUMERALS

Figure 1:
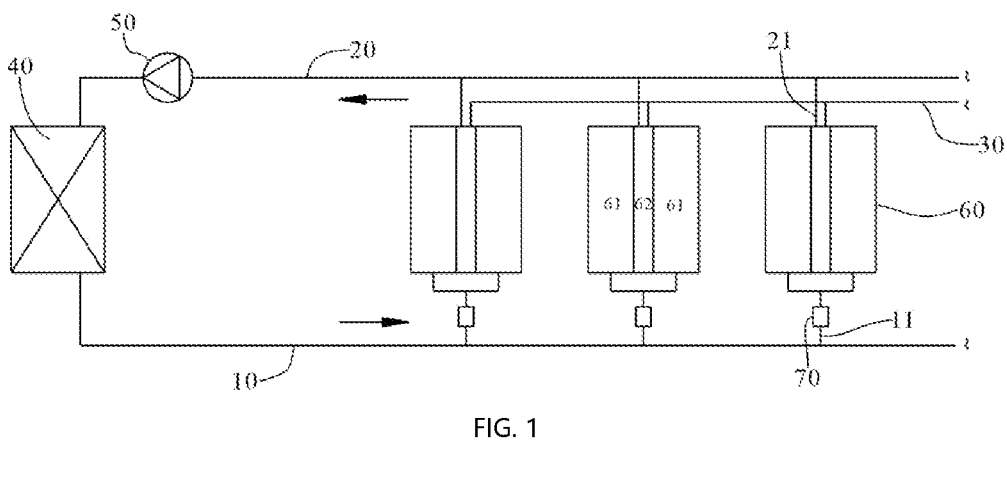
FIG. 1 is a schematic structural diagram of a liquid cooling system according to an embodiment of this application.

10—liquid supply main pipe,

11—liquid supply sub-pipe,

20—liquid return main pipe,

21—liquid return sub-pipe,
30—balance pipe,
40—heat exchange unit,
50—power unit,
60—liquid cooling cabinet,
61—electronic device area,
62—liquid return groove,
70—flow regulation unit,
71—pressure difference detection apparatus,
72—flow regulation apparatus,
711—first pressure sensor,
712—second pressure sensor,
713—pressure difference structure component, and
80—control unit.

DETAILED DESCRIPTION

To better understand the foregoing technical solution, the following specifically describes exemplary embodiments of this application with reference to the accompanying drawings. Apparently, the described embodiments are merely some but not all of the embodiments of this application, and it should be understood that, this application is not limited by the exemplary embodiments described herein.

In some embodiments, when single-phase immersion liquid cooling heat dissipation is used in an electronic device, at least one single-phase immersion liquid cooling cabinet may be connected in parallel and placed on a liquid supply/return main pipe. In this case, there may be a regulation problem about a flow relationship of a coolant in one liquid cooling cabinet or a regulation problem about a flow relationship of the coolant in parallel branches corresponding to a plurality of liquid cooling cabinets. For example, in a scenario that a plurality of liquid cooling cabinets are connected in parallel, different positions of the liquid cooling cabinets on the liquid supply/return main pipe determine that flow paths of the coolant are not exactly the same, causing an imbalance in flows of the coolant in the parallel branches, and elimination of the imbalance involves regulation on the flows of the coolant in the branches; in addition, heat dissipation loads of electronic devices in the liquid cooling cabinets are different due to their different powers, and requirements for the flows of the coolant in the parallel branches are also different in consideration of reducing costs, which also involves the regulation on the flows of the coolant in the branches; in a word, to regulate the flow of the coolant in each liquid cooling cabinet as required, a flow of the coolant flowing into the liquid cooling cabinet needs to be regulated, and even a flow of the coolant flowing out of the liquid cooling cabinet also needs to be regulated.

In related technologies, an inlet/outlet valve of the liquid cooling cabinet may be manually regulated to regulate the flow of the coolant in the liquid cooling cabinet. However, the foregoing method of manually regulating the flows of the coolant has limited precision for one or more liquid cooling cabinets. In addition, in a scenario that the plurality of liquid cooling cabinets are connected in parallel, because of the parallel relationship between the plurality of liquid cooling cabinets, after a flow of the coolant in one of the liquid cooling cabinets is regulated, there may be an imbalance in flows of the coolant in other parallel branches in the whole system. Therefore, the flow of the coolant in each parallel branch in the liquid cooling system further needs to be regulated, resulting in low efficiency. In view of this, an embodiment of this application provides a single-phase immersion liquid cooling system, the liquid cooling system can associate flows of the coolant in one liquid cooling cabinet or more liquid cooling cabinets with pressure differences of the coolant, which are convenient to be accurately measured, so that in a scenario including one or more liquid cooling cabinets, the liquid cooling system can automatically regulate the flows of the coolant in the one or more liquid cooling cabinets based on the pressure differences of the coolant, thereby improving regulation precision and regulation efficiency.

Figure 2:
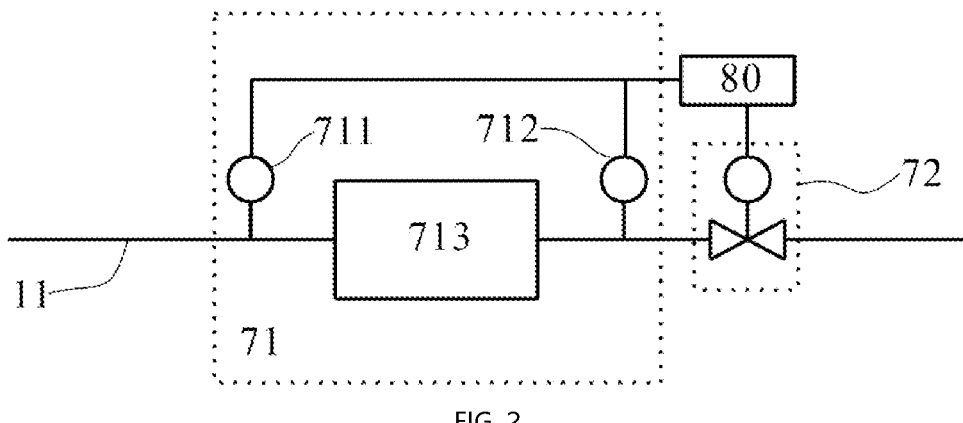
FIG. 2 is a schematic structural diagram of a flow regulation unit according to an embodiment of this application.

FIG. 1 is a schematic structural diagram of the liquid cooling system according to this embodiment of this application, and FIG. 2 is a schematic structural diagram of a flow regulation unit.

With reference to FIG. 1 and FIG. 2, a single-phase immersion liquid cooling system includes a liquid supply main pipe 10, a liquid return main pipe 20, at least one liquid cooling cabinet 60, a flow regulation unit 70, and a control unit 80. It should be noted that, although the liquid cooling system in FIG. 1 includes a plurality of liquid cooling cabinets 60, the liquid cooling system may be implemented to include only one liquid cooling cabinet 60. The liquid return main pipe 20 and the liquid supply main pipe 10 form a circulation loop for a coolant.

In a scenario that the liquid cooling system includes only one liquid cooling cabinet 60, the liquid cooling cabinet 60 is connected between the liquid supply main pipe 10 and the liquid return main pipe 20.

In a scenario that the liquid cooling system includes a plurality of liquid cooling cabinets 60, the plurality of liquid cooling cabinets 60 are connected in parallel between the liquid supply main pipe 10 and the liquid return main pipe 20. Each liquid cooling cabinet 60 includes a liquid inlet and a liquid return opening, the liquid inlet of each liquid cooling cabinet 60 being in communication with the liquid supply main pipe 10 through a liquid supply sub-pipe 11 of each liquid cooling cabinet, and the liquid return opening of each liquid cooling cabinet 60 being in communication with the liquid return main pipe 20 through a liquid return sub-pipe 21 of each liquid cooling cabinet 60; the flow regulation unit 70 includes a pressure difference detection apparatus 71 and a flow regulation apparatus 72, the pressure difference detection apparatus 71 being used to detect a pressure difference between a coolant flowing into the pressure difference detection apparatus 71 and a coolant flowing out of the pressure difference detection apparatus 71, and the flow regulation apparatus 72 being used to regulate a flow of the coolant; wherein the pressure difference detection apparatus 71 and the flow regulation apparatus 72 are separately in a signal connection to a control unit 80; the liquid supply sub-pipe 11 is provided with the flow regulation unit 72, so that the control unit 80 regulates, based on the pressure difference of the at least one liquid supply sub-pipe 11, the flow of the coolant flowing into the at least one liquid supply sub-pipe 11.

First, the liquid supply main pipe 10 and the liquid return main pipe 20 form the circulation loop, and the coolant circulates in the circulation loop. There may be only one liquid cooling cabinet 60 or a plurality of liquid cooling cabinets 60 connected in parallel on the circulation loop. Each liquid cooling cabinet 60 is in communication with the liquid supply main pipe 10 and the liquid return main pipe 20 through its liquid supply sub-pipe 11 and liquid return sub-pipe 21 respectively, so that the coolant can flow through the liquid cooling cabinet 60, and heat is dissipated from the electronic device in the liquid cooling cabinet 60 through liquid cooling.

Second, in this embodiment, the liquid supply sub-pipe 11 is provided with the flow regulation unit 70, and the flow regulation unit 70 is used to regulate the flow of the coolant based on the pressure difference of the coolant. The flow regulation unit 70 includes the pressure difference detection apparatus 71 and the flow regulation apparatus 72, wherein the pressure difference detection apparatus 71 is used to detect the pressure difference of the coolant, the flow regulation apparatus 72 is used to regulate the flow of the coolant, and the flow regulation apparatus 72 is, for example, a flow regulator valve.

Specifically, a fluid such as the coolant generates a pressure difference before and after flowing through a fixed structure, and pressure differences of the coolants with different flows before and after flowing through a same fixed structure are also different. That is, a coolant with a larger flow generates a larger pressure difference before and after flowing through the fixed structure, and a coolant with a smaller flow generates a smaller pressure difference before and after flowing through the fixed structure. Based on the foregoing principle, the pressure difference detection apparatus 71 of this embodiment is used to detect the pressure difference, and then the control unit 80 regulates the flow regulation apparatus 72 based on the detected pressure difference, thereby regulating the flow of one liquid cooling cabinet 60 or regulating the flows of the coolant in the parallel branches corresponding to the plurality of liquid cooling cabinets 60.

For the relationship between the pressure difference and the flow, a pressure difference-flow relationship table can be determined based on an actual condition, and the pressure difference-flow relationship table is affected by many factors, such as a structure of the pressure difference detection apparatus, and composition and temperature of the coolant.

For example, for one parallel branch, the parallel branch has a target flow value, and further, based on the foregoing pressure difference-flow relationship table, the parallel branch corresponds to a target pressure difference value, and the control unit 80 can regulate the flow by regulating an opening degree of the flow regulator valve or the like, so that the detected pressure difference value detected by the pressure difference detection apparatus 71 is tended to be consistent with the foregoing target pressure difference value, which indicates that in this case, the actual flow value (corresponding to the foregoing pressure difference) of the coolant in the parallel branch is a required target flow value.

Further, for a plurality of parallel branches, the control unit 80 may automatically regulate the flow of the coolant in each branch, respectively, so that the coolant in the branches can be regulated as required with high regulation precision and regulation efficiency. In addition, the control unit 80 may automatically regulate the flows of the coolant in one or several branches in the plurality of parallel branches.

The embodiments of this application provide a single-phase immersion liquid cooling system and a liquid cooling method, wherein the liquid cooling system includes a liquid supply main pipe 10 and a liquid return main pipe 20, the liquid supply main pipe 10 and the liquid return main pipe 20 forming a circulation loop, and at least one liquid cooling cabinet, each liquid cooling cabinet including a liquid inlet and a liquid return opening, the liquid inlet of each liquid cooling cabinet being in communication with the liquid supply main pipe through a liquid supply sub-pipe of each liquid cooling cabinet, and the liquid return opening of each liquid cooling cabinet being in communication with the liquid return main pipe through a liquid return sub-pipe of each liquid cooling cabinet; further, in embodiments of this application, the liquid supply sub-pipe 11 is provided with a flow regulation unit 70, and the flow regulation unit 70 includes a pressure difference detection apparatus 71 and a flow regulation apparatus 72, the pressure difference detection apparatus 71 and the flow regulation apparatus 72 being separately in a signal connection to a control unit 80, and the pressure difference detection apparatus 71 is used to detect a pressure difference of a coolant flowing through it, that is, the pressure difference detection apparatus 71 is used to detect a pressure difference between a coolant flowing into the pressure difference detection apparatus 71 and a coolant flowing out of the pressure difference detection apparatus 72. The flow regulation apparatus 72 is used to regulate a flow of the coolant passing through it, so that for the corresponding liquid supply sub-pipe 11, the control unit 80 can regulate, based on the pressure difference of the liquid supply sub-pipe 11, a flow of the coolant flowing into the liquid supply sub-pipe 11.

In a word, in the embodiments of this application, by arranging the flow regulation unit 70 on the liquid supply sub-pipe 11, the flow regulation unit 70 can reflect the flow of the coolant by the pressure difference, so that the flow of the coolant can be accurately known by measuring the pressure difference, and the flow of the coolant can be regulated based on the pressure difference. In this way, in a scenario that the liquid cooling system includes only one liquid cooling cabinet 60, the liquid cooling system can regulate a flow of the single liquid cooling cabinet 60 as required, and regulation precision can be improved. In a scenario that the liquid cooling system includes a plurality of liquid cooling cabinets 60, in the embodiments of this application, respective flows of the coolant in the parallel branches can be regulated as required, regulation precision can be improved, and an imbalance in the flows of the coolant in different branches can be avoided.

In one embodiment, the pressure difference detection apparatus 71 includes a pressure difference structure component 713, and a first pressure sensor 711 and a second pressure sensor 712 that are separately arranged on two ends of the pressure difference structure component 713, for example, the first pressure sensor 711 being arranged at a first end of the pressure difference structure component 713 and the second pressure sensor 712 being arranged at a second end of the pressure difference structure component 713; wherein the pressure difference structure component 713 is used to provide resistance for coolant flowing. In this way, when the coolant flows through the pressure difference structure component 713, there is a positive correlation between the detected pressure difference value (that is, the pressure difference) obtained by subtracting a first detection value of the first pressure sensor 711 from a second detection value of the second pressure sensor 712 or subtracting a second detection value of the second pressure sensor 712 from a first detection value of the first pressure sensor 711 and the flow of the coolant flowing through the pressure difference structure component 713.

With reference to FIG. 2, in this embodiment, the pressure difference detection apparatus 71 specifically includes the pressure difference structure component 713, and the pressure difference structure component 713 may be a resistance component that can generate resistance for the flowing of a fluid such as the coolant, for example, the resistance component can be implemented by narrowing a flow channel of the coolant or arranging a blocking structure on the flow channel, so that a pressure loss is generated after the coolant flows through the pressure difference structure component, that is, a pressure difference is generated.

It can be understood that, for a fluid such as the coolant with a same flow, different blocking structure can realize different resistance effects represented by generation of different pressure differences, and in this embodiment, a resistance coefficient & is used to represent the different resistance effects caused by different resistance structures, that is, a pressure difference structure component with a fixed structure has a fixed resistance coefficient €.

In addition, for the coolant with a certain flow, there will be a pressure loss &P after the coolant flows through the pressure difference structure component, and the pressure loss 8P can be represented as a function of the resistance coefficient & of the pressure difference structure component and the flow Q of the coolant, that is:

$$\delta P = C \xi Q^2 \qquad \text{Formula 1}$$

wherein C in Formula 1 is a constant.

It can be learned from Formula 1 that, the flow Q of the coolant can be determined by measuring the pressure loss 8P of the coolant after flowing through the pressure difference structure component.

Further, with respect to measurement of the pressure loss δP, specifically in this embodiment, the first pressure sensor 711 and the second pressure sensor 712 are arranged on the two ends of the pressure difference structure component 713 respectively, and the pressure loss δP is the first detection value P1 of the first pressure sensor subtracted from the second detection value P2 of the second pressure sensor or the second detection value P2 of the second pressure sensor subtracted from the first detection value P1 of the first pressure sensor, that is:

$$P2 - P1 = \delta P \qquad \text{Formula 2}$$

A combination of Formula 1 and Formula 2 derives:

$$P2 - P1 = \delta P = C \xi Q^2 \qquad \text{Formula 3}$$

It can be learned from Formula 3 that, there is a positive correlation between the detected pressure difference value (that is, the foregoing pressure difference) obtained by subtracting the first detection value P1 of the first pressure sensor 711 from the second detection value P2 of the second pressure sensor 712 or subtracting the second detection value P2 of the second pressure sensor 712 from the first detection value P1 of the first pressure sensor 711 and a flow of the coolant flowing through the pressure difference structure component 713, that is, the larger the flow, the larger the detected pressure difference value, and on the contrary, the smaller the flow, the smaller the detected pressure difference value. Specifically, the detected pressure difference value is directly proportional to the square of the flow Q. In addition, the control unit 80 regulates an opening degree of the flow regulation apparatus 72 based on the received P1 and P2, to regulate the flow Q of the coolant into the target flow value, and in addition, the foregoing pressure difference-flow relationship table can be obtained by calculation according to Formula 3.

In one embodiment, the flow regulation apparatus 72 includes an electrically operated valve, the electrically operated valve being in a signal connection to the control unit 80, and the control unit 80 is used to dynamically regulate an opening degree of the electrically operated valve based on the detected pressure difference value.

That is, the flow regulation apparatus 72 in this embodiment includes the electrically operated valve, the electrically operated valve is in a signal connection to the control unit 80, so that the control unit 80 can conveniently regulate the opening degree of the electrically operated valve. Wherein the opening degree is a degree or size of opening of the electrically operated valve; that is, the control unit 80 dynamically regulates the opening degree of the electrically operated valve based on the detected pressure difference value (the foregoing P1-P2).

More specifically, the electrically operated valve may be a 2-way proportional regulator valve, and the opening degree of the 2-way proportional regulator valve may be regulated in a continuous linear manner, thereby improving precision of control on the flow of the coolant.

In one specific embodiment, with respect to dynamical regulation on the opening degree of the electrically operated valve, the control unit 80 is specifically used to:

obtain a target pressure difference value of the at least one liquid supply sub-pipe;

in a case that a detected pressure difference value of one liquid supply sub-pipe is less than the target pressure difference value of the liquid supply sub-pipe, control the opening degree of the electrically operated valve corresponding to the liquid supply sub-pipe to increase; and in a case that the detected pressure difference value of the one liquid supply sub-pipe is greater than the target pressure difference value of the liquid supply sub-pipe, control the opening degree of the electrically operated valve corresponding to the liquid supply sub-pipe to decrease.

That is, for a parallel branch in the circulation loop, after the pressure difference detection apparatus of the parallel branch is determined, it can be learned from Formula 3 that, the target pressure difference value corresponding to the target flow value of the parallel branch is determined; the control unit 80 may first obtain the target pressure difference value of each liquid supply sub-pipe (a liquid supply sub-pipe corresponds to a parallel branch); and then the control unit controls the detected pressure difference value corresponding to the liquid supply sub-pipe to tend to approximate to the target pressure difference value; that is:

when the detected pressure difference value (that is, the pressure difference) of one liquid supply sub-pipe 11 is less than the target pressure difference value of the liquid supply sub-pipe 11, it indicates that the flow of the coolant in the liquid supply sub-pipe 11 is less than the target flow value; in this case, the control unit 80 needs to control the opening degree of the electrically operated valve on the liquid supply sub-pipe 11 to increase, to increase the flow of the coolant; and when the detected pressure difference value of one liquid supply sub-pipe 11 is greater than the target pressure difference value of the liquid supply sub-pipe 11, it indicates that the flow of the coolant in the liquid supply sub-pipe 11 is greater than the target flow value, and in this case, the control unit 80 needs to control the opening degree of the electrically operated valve on the liquid supply sub-pipe 11 to decrease, to decrease the flow of the coolant.

In a word, for one liquid supply sub-pipe, the control unit 80 dynamically regulates the opening degree of the electrically operated valve on the liquid supply sub-pipe 11 based on a condition of comparison between the detected pressure difference value and the target pressure difference value of the liquid supply sub-pipe 11, so that the detected pressure difference value is tended to be equal to the target pressure difference value, and in this case, the flow of the coolant in the liquid supply sub-pipe 11 is the required target flow value; in addition, for different parallel branches in the whole liquid cooling system, the control unit can independently regulate the different parallel branches. In one specific embodiment, a heat exchange unit 40 and a power unit 50 are further arranged between the liquid supply main pipe 10 and the liquid return main pipe 20, the heat exchange unit 40 is used to cool the coolant, the power unit 50 is used to supply power for coolant flowing (for example, power for circulating in the circulation loop), and the power unit 50 is further in a signal connection to the control unit 80; wherein the control unit 80 is used to:

> dynamically regulate an operating power of the power unit 50 based on a condition of matching between the detected pressure difference value (that is, the pressure difference) and the corresponding target pressure difference value of at least one liquid supply sub-pipe 11 and the opening degree of at least one electrically operated valve. In one embodiment, the power unit 50 is, for example, a power pump, and the power pump drives the coolant to circulate in the circulation loop; the heat exchange unit 40 is, for example, a heat exchanger, the heat exchanger is used to cool the coolant, and then the cooled coolant flows into the liquid cooling cabinet 60, so that heat is dissipated from the electronic device through liquid cooling.

In this embodiment, the control unit 80 is further in a signal connection to the power unit 50, that is, the control unit 80 can control the operating power of the power unit 50; specifically, the control unit 80 dynamically regulates the operating power of the power unit 50 based on a condition of matching between the detected pressure difference value and the corresponding target pressure difference value of the at least one liquid supply sub-pipe in the circulation loop and the opening degree of the at least one electrically operated valve, so that the power unit 50 in the liquid cooling system always operates in a most energy-saving state, and costs are reduced.

In one specific embodiment, with respect to dynamical regulation on the operating power of the power unit 50, the control unit 80 is specifically used to:

> monitor the opening degree of the electrically operated valve and the detected pressure difference value (that is, the pressure difference) of the at least one liquid supply sub-pipe;
>
> in a case that the opening degree of the at least one electrically operated valve is at a maximum value and the detected pressure difference value is less than the corresponding target pressure difference value, increase the operating power of the power unit 50; and
>
> in a case that the detected pressure difference value of each of the at least one liquid supply sub-pipe 11 reaches the corresponding target pressure difference value and opening degrees of all electrically operated valves do not reach respective maximum values, decrease the operating power of the power unit 50.

In this embodiment, based on an actual condition, the control unit 80 first monitors the opening degree of the electrically operated valve and the detected pressure difference value of at least one parallel branch, and certainly, the control unit 80 may monitor the opening degree of the electrically operated valve and the detected pressure difference value of each parallel branch.

Then, when the opening degree of the electrically operated valve in one parallel branch is at a maximum value and the detected pressure difference value of the branch is still less than the target pressure difference value, it indicates that the flow of the coolant cannot reach the target flow value by increasing the opening degree of the electrically operated valve in the branch, and in this case, the control unit needs to increase the operating power of the power unit (that is, raise frequency for the power unit to increase a rotational speed), to increase a total circulation flow of the coolant, thereby avoiding a case that heat cannot be fully dissipated from the electronic device because the coolant in this branch cannot reach the target flow value.

In addition, when the detected pressure difference values of the branches in the circulation loop all reach respective corresponding target pressure difference values and the opening degrees of the electrically operated valves of all the branches do not reach respective maximum values, in other words, when the detected pressure difference values of the branches in the circulation loop all reach respective corresponding target pressure difference values and an opening degree of an electrically operated valve of no branch reaches a maximum value, it indicates that now the parallel branches in the circulation loop all satisfy respective target flow values, the electrically operated valves of the parallel branches are all in a partially opened state, that is, the power unit 50 is possible to do useless work, and in this case, the control unit may decrease the operating power of the power unit (that is, reduce frequency for the power unit to decrease a rotational speed), to decrease the total circulation flow of the coolant, thereby avoiding energy wastes caused by the useless work did by the power unit.

In a word, after controlling the power unit 50 to increase the operating power or decrease the operating power, the control unit 80 may further regulate the opening degrees of the electrically operated valves of the parallel branches based on a new circulation flow of the coolant, until the detected pressure difference values of all parallel branches equal to the target pressure difference values.

It should be understood that, the control unit 80 in this embodiment dynamically controls the foregoing power unit 50 and the electrically operated valves of the branches separately, so that when all parallel branches satisfy respective target flow values, an electrically operated valve of at least one parallel branch needs to be in a state of having a maximum opening degree, and only in this case, the liquid cooling system is in a stable, precise, and most energy-saving control state.

In one embodiment, both the liquid supply sub-pipe 11 and the liquid return sub-pipe 21 are provided with the flow regulation unit 70, so that the control unit 80 regulates, based on the pressure difference of the at least one liquid supply sub-pipe 11, the flow of the coolant flowing into the liquid supply sub-pipe 11, and regulates, based on the pressure difference of the at least one liquid return sub-pipe 21, the flow of the coolant flowing out of the liquid return sub-pipe 21.

That is, in this embodiment, the liquid return sub-pipe may further be provided with the foregoing flow regulation unit 70, to regulate not only the flow of the coolant flowing into the liquid cooling cabinet 60, but also the flow of the coolant flowing out of the liquid cooling cabinet 60, thereby improving regulation precision.

In one embodiment, each liquid cooling cabinet 60 includes an electronic device area 61 and a liquid return groove 62, the liquid inlet being arranged at the electronic device area 61, and the liquid return opening being arranged at the liquid return groove 62; the liquid cooling system further includes a balance pipe 30, and the balance pipe 30 is in communication with the liquid return grooves 62 of the plurality of liquid cooling cabinets 60, to balance liquid levels in the plurality of liquid return grooves 62.

In this embodiment, specifically, the liquid cooling cabinet is, for example, a single-phase immersion liquid cooling cabinet, and with reference to FIG. 1, it is convenient to understand that, the liquid cooling cabinet 60 is provided with the electronic device area 61 and the liquid return groove 62, the liquid inlet being arranged on the bottom of the electronic device area 61, and the liquid return opening being arranged on the bottom of the liquid return groove 62, and the coolant flows into the electronic device area 61 from the liquid inlet, then overflows to the liquid return groove 62 from the top after a heat exchange with the electronic device, and flows out of the liquid cooling cabinet 60 from the liquid return opening.

For the several liquid cooling cabinets 60 in the circulation loop, in this embodiment, the balance pipe is in communication with the plurality of liquid return grooves 62, so that the liquid levels in the plurality of liquid return grooves 62 are tended to be consistent by the law of communicating vessels, that is, the liquid levels in the plurality of liquid return grooves 62 are balanced, thereby avoiding a phenomenon that a liquid in a liquid return groove 62 of one liquid cooling cabinet 60 is excessive and overflows.

Based on the foregoing single-phase immersion liquid cooling system, the embodiments of this application further provide a liquid cooling method, and with reference to FIG. 4, the liquid cooling method is applied to the foregoing liquid cooling system, and the liquid cooling method includes:

S10: Obtaining a pressure difference of at least one liquid supply sub-pipe;

S20: Monitoring the pressure difference of the at least one liquid supply sub-pipe that is obtained by a pressure difference detection apparatus;

S30: Dynamically regulating an opening degree of a flow regulation unit of each of the at least one liquid supply sub-pipe based on a condition of comparison between a target pressure difference value and the corresponding pressure difference of the at least one liquid supply sub-pipe.

In the liquid cooling method provided in this embodiment, with reference to the following Table 1 (Table 1 takes an example of six parallel branches), first a target pressure difference value of each branch is obtained; then a detected pressure difference value (that is, a pressure difference) of each branch is monitored, wherein the detected pressure difference value is obtained by the pressure difference detection apparatus, and specifically, the detected pressure difference value is obtained by subtracting a detected value of a first pressure sensor from that of a second pressure sensor or subtracting the detected value of the second pressure sensor from that of the first pressure sensor; then an opening degree of a flow regulation unit of each parallel branch is dynamically regulated based on a condition of comparison between the target pressure difference value and the detected pressure difference value of the parallel branch; that is, for example, for the parallel branch (or liquid supply sub-pipe) S3, in the liquid cooling method of this embodiment, an opening degree M3 is dynamically regulated based on a condition of comparison between PJ3 and PO3.

TABLE 1

A table of a correspondence relationship between the target flow values, the
target pressure difference values, the detected pressure difference values,
and the opening degrees of the flow regulation units in the parallel branches

| Parallel branch/Liquid supply sub-pipe | Target flow value | Target pressure difference value | Detected pressure difference value | Opening degree of the flow regulation unit |
|---|---|---|---|---|
| S1 | Q1 | PO1 | PJ1 | M1 |
| S2 | Q2 | PO2 | PJ2 | M2 |
| S3 | Q3 | PO3 | PJ3 | M3 |
| S4 | Q4 | PO4 | PJ4 | M4 |
| S5 | Q5 | PO5 | PJ5 | M5 |
| S6 | Q6 | PO6 | PJ6 | M6 |

In Table 1, the target flow values and the target pressure difference values can be calculated according to Formula 1.

Certainly, in actual use, flows of only one or several branches of the foregoing six parallel branches may be regulated.

In an embodiment, step S30 includes:

S301: In a case that the detected pressure difference value of one liquid supply sub-pipe is less than the target pressure difference value of the liquid supply sub-pipe, control the opening degree of the flow regulation unit corresponding to the liquid supply sub-pipe to increase;

S302: In a case that the detected pressure difference value of the one liquid supply sub-pipe is greater than the target pressure difference value of the liquid supply sub-pipe, control the opening degree of the flow regulation unit corresponding to the liquid supply sub-pipe to decrease.

That is, still taking an example of the parallel branch S3, when PJ3 is less than PO3, the opening degree M3 is regulated to be increased, and when PJ3 is greater than PO3, the opening degree M3 is regulated to be decreased, and in a word, an objective of the embodiments is to make PJ3 tended to be equal to PO3.

In one embodiment, a heat exchange unit 40 and a power unit 50 are further arranged on the circulation loop of the liquid cooling system, the heat exchange unit 40 used to cool the coolant circulating in the circulation loop, and the power unit 50 used to supply power for the coolant to circulate in the circulation loop, and the power unit 50 is further in a signal connection to the control unit 80; wherein the liquid cooling method further includes:

S40: Dynamically regulating an operating power of the power unit based on a condition of matching between the pressure difference and the corresponding target pressure difference value of the at least one liquid supply sub-pipe and the opening degree of at least one flow regulation unit.

That is, the control unit of this embodiment is further in a signal connection to the power unit, so that the control unit dynamically regulates the operating power of the power unit based on the conditions of matching between PJs and POs of the parallel branches S1-S6 and opening degrees Ms of the flow regulation units.

In an embodiment, step S40 includes:

S401: Monitoring the opening degree and the pressure difference of the flow regulation unit of the at least one liquid supply sub-pipe.

S402: In a case that the opening degree of the flow regulation unit is at a maximum value and the pressure difference is less than the target pressure difference value corresponding to the pressure difference, increasing the operating power of the power unit.

S403: In a case that the pressure difference values all reach the respective corresponding target pressure difference values and the opening degrees of all electrically operated valves do not reach respective maximum values, decrease the operating power of the power unit.

Specifically, still referring the foregoing Table 1, the detected pressure difference values PJs and the opening degrees Ms of the flow regulation units in Table 1 are detected first.

For example, for a parallel branch S5, when it is monitored that M5 is at a maximum opening degree, and PJ5 is still less than PO5, the operating power of the power unit is increased; that is, for the six parallel branches in Table 1, as long as the foregoing case occurs on one of the branches, it indicates that the circulation flow of the coolant in the circulation loop is small, and a total circulation flow of the coolant needs to be increased, thereby avoiding a case that heat cannot be fully dissipated from the electronic device because the coolant in this branch cannot reach the target flow value.

Then, when all PJs are equal to respective POs, and all Ms do not reach respective maximum values, that is, all of M1-M6 do not reach respective maximum opening degrees, the operating power of the power unit needs to be decreased; that is, for the six parallel branches in Table 1, in a case that all branches satisfy respective target flow values, and an opening degree of a flow regulation unit of no branch is at a maximum opening degree, it indicates that the power unit makes useless work, and in this case, the control unit needs to decrease the operating power of the power unit, to decrease the total circulation flow of the coolant, thereby avoiding energy wastes caused by the useless work made by the power unit.

In this way, the foregoing power unit and the electrically operated valves of the branches are separately dynamically controlled, so that in a case that parallel branches (S1-S6) all satisfy respective target flow values (Q1-Q6), an electrically operated valve of at least one parallel branch needs to be in a state of having a maximum opening degree, and only in this case, the liquid cooling system is in a stable, precise, and most energy-saving control state.

Further, it should be understood that, after the operating power of the power unit is decreased, because the total circulation flow of the coolant in the liquid supply main pipe and the liquid return main pipe is reduced, in this case, the electrically operated valves of the branches cannot maintain the previous flow in a state of the previous opening degree, that is, the opening degrees of the electrically operated valves of the branches need to be readjusted to establish a dynamic balance, and after the dynamic balance is established, the control unit regulates the operating power of the power unit again based on the opening degrees of the electrically operated valves of the branches; that is, the control unit controls the power unit and the electrically operated valves of the branches only through mutual collaborated regulation instead of completely independent of each other. The above describes basic principles of this application with reference to specific embodiments, however, it should be noted that the advantages, strengths, effects, and the like mentioned in this application are merely examples but not limitations, and these advantages, strengths, effects, and the like cannot be considered to be necessary for each embodiment of this application. In addition, the specific details disclosed above are merely for illustrative purposes and to be easy to understand rather than limitation, and the above details do not limit this application to be implemented with the above specific details.

The block diagrams of the devices, apparatuses, equipment, and systems involved in this application are merely illustrative examples and are not intended to require or imply that the devices, apparatuses, equipment, and systems need to be connected, arranged, and configured in the manner shown in the block diagrams. A person skilled in the art will realize that the devices, apparatuses, equipment, and systems can be connected, arranged, and configured in any manner. Terms such as "comprise", "include", "have", and the like are open terms that mean "comprising but not limited to" and may be used interchangeably with the latter. The terms "or" and "and" used herein refer to the terms "and/or" and may be used interchangeably with the latter, unless the context clearly dictates otherwise. The expression "such as" used herein refers to the phrase "such as but not limited to" and may be used interchangeably with the latter.

It should be further noted that in the apparatuses, devices, and methods of this application, the components or steps may be decomposed and/or recombined. Such decomposition and/or recombination shall be regarded as equivalent solutions of this application.

The above description of the disclosed aspects is provided to enable a person skilled in the art to implement or use this application. Various modifications to these aspects are obvious to a person skilled in the art, and the general principles defined herein can be applied to other aspects without departing from the scope of this application. Therefore, this application is not intended to be limited to the aspects shown herein but in accordance with the widest scope consistent with the principles and novel features disclosed herein.

The above description has been given for the purposes of illustration and description. In addition, this description is not intended to limit the embodiments of this application to the form disclosed herein. Although a plurality of example aspects and embodiments have been discussed above, a person skilled in the art realizes some variations, modifications, changes, additions, and sub-combinations thereof shall fall within the protection scope of this application.

What is claimed is:

1. A single-phase immersion liquid cooling system, wherein the liquid cooling system comprises:

a liquid supply main pipe;

a liquid return main pipe;

at least one liquid cooling cabinet, wherein each liquid cooling cabinet comprises a liquid inlet and a liquid return opening, the liquid inlet of each liquid cooling cabinet is in communication with the liquid supply main pipe through a liquid supply sub-pipe of each liquid cooling cabinet, and the liquid return opening of each liquid cooling cabinet is in communication with the liquid return main pipe through a liquid return sub-pipe of each liquid cooling cabinet; and a flow regulation unit, comprising a pressure difference detection apparatus and a flow regulation apparatus, wherein the pressure difference detection apparatus is used to detect a pressure difference between a coolant flowing into the pressure difference detection apparatus and a coolant flowing out of the pressure difference detection apparatus, and the flow regulation apparatus is used to regulate a flow of the coolant;

wherein the pressure difference detection apparatus and the flow regulation apparatus are separately in a signal connection to a control unit; and the liquid supply sub-pipe is provided with the flow regulation unit, so that the control unit regulates, based on the pressure difference of the at least one liquid supply sub-pipe, a flow of a coolant flowing into the at least one liquid supply sub-pipe, wherein the pressure difference detection apparatus comprises a blocking structure, a first pressure sensor arranged at a first end of the blocking structure, and a second pressure sensor arranged at a second end of the blocking structure; wherein the blocking structure is used to provide resistance for coolant flowing, so that when the coolant flows through the blocking structure, there is a positive correlation between the pressure difference, obtained by subtracting a first detection value of the first pressure sensor from a second detection value of the second pressure sensor or subtracting the second detection value of the second pressure sensor from the first detection value of the first pressure sensor, and a flow of the coolant flowing through the blocking structure, wherein the flow regulation apparatus comprises an electrically operated valve, wherein the electrically operated valve is in a signal connection to the control unit, and the control unit is used to dynamically regulate an opening degree of the electrically operated valve based on the pressure difference, a power unit is further arranged between the liquid supply main pipe and the liquid return main pipe, the power unit is used to supply power for coolant flowing, and the power unit is further in a signal connection to the control unit;

wherein the control unit is used to:

obtain a target pressure difference value of the at least one liquid supply sub-pipe;

monitor the opening degree of the electrically operated valve and the pressure difference of the at least one liquid supply sub-pipe;

in a case that the opening degree of the electrically operated valve is at a maximum value and the pressure difference is less than the corresponding target pressure difference value, increase the operating power of the power unit; and in a case that the pressure difference of each of the at least one liquid supply sub-pipe reaches the corresponding target pressure difference value and opening degrees of all electrically operated valves do not reach respective maximum values, decrease the operating power of the power unit.

2. The liquid cooling system according to claim 1, wherein the liquid return sub-pipe is provided with the flow regulation unit, so that the control unit regulates, based on the pressure difference of the at least one liquid return sub-pipe, a flow of a coolant flowing out of the at least one liquid return sub-pipe.

3. The liquid cooling system according to claim 1, wherein the liquid cooling system comprises a plurality of liquid cooling cabinets, the plurality of liquid cooling cabinets are connected in parallel between the liquid supply main pipe and the liquid return main pipe.

4. The liquid cooling system according to claim 1, wherein the liquid cooling cabinet comprises an electronic device area and a liquid return groove, the liquid inlet being arranged at the electronic device area, and the liquid return opening being arranged at the liquid return groove; and the liquid cooling system further comprises:

a balance pipe, wherein the balance pipe is in communication with the liquid return grooves of the plurality of liquid cooling cabinets to balance liquid levels in the plurality of liquid return grooves.

5. The liquid cooling system according to claim 1 wherein the control unit is used to:

in a case that the pressure difference of one liquid supply sub-pipe is less than the target pressure difference value of the liquid supply sub-pipe, control the opening degree of the electrically operated valve corresponding to the liquid supply sub-pipe to increase; and in a case that the pressure difference of one liquid supply sub-pipe is greater than the target pressure difference value of the liquid supply sub-pipe, control the opening degree of the electrically operated valve corresponding to the liquid supply sub-pipe to decrease.

6. The liquid cooling system according to claim 1, wherein a heat exchange unit is further arranged between the liquid supply main pipe and the liquid return main pipe, wherein the heat exchange unit is used to cool the coolant.

7. A liquid cooling method, wherein the liquid cooling method is applied to the liquid cooling system according to any one of claims 1 to 4 and 5 to 6, and the liquid cooling method comprises:

dynamically regulating an opening degree of a flow regulation unit of each of the at least one liquid supply sub-pipe based on a condition of comparison between the target pressure difference value and the pressure difference of the at least one liquid supply sub-pipe.

8. The liquid cooling method according to claim 7, wherein the step of dynamically regulating an opening degree of a flow regulation unit of each of the at least one liquid supply sub-pipe based on a condition of comparison between the target pressure difference value and the pressure difference of the at least one liquid supply sub-pipe comprises:

in a case that the pressure difference of one liquid supply sub-pipe is less than the target pressure difference value of the liquid supply sub-pipe, controlling the opening degree of the flow regulation unit corresponding to the liquid supply sub-pipe to increase; and in a case that the pressure difference of one liquid supply sub-pipe is greater than the target pressure difference value of the liquid supply sub-pipe, controlling the opening degree of the flow regulation unit corresponding to the liquid supply sub-pipe to decrease.

9. The liquid cooling method according to claim 8, wherein a heat exchange unit is further arranged in the liquid cooling system, wherein the heat exchange unit is used to cool a coolant.

10. A non-transitory computer-readable storage medium, comprising program instructions, wherein the program instructions, when being executed by a control unit, enable the control unit to perform the method according to claim 7.

\* \* \* \* \*